United States Patent
Marshall

(10) Patent No.: US 6,236,230 B1
(45) Date of Patent: May 22, 2001

(54) METHOD, ARCHITECTURE AND CIRCUIT FOR PRODUCT TERM ALLOCATION

(75) Inventor: Jeffrey Mark Marshall, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/322,946

(22) Filed: May 28, 1999

Related U.S. Application Data
(60) Provisional application No. 60/093,742, filed on Jul. 21, 1998.

(51) Int. Cl.[7] .................. H03K 19/173; H03K 19/177
(52) U.S. Cl. .................................. 326/39; 326/38
(58) Field of Search ....................... 326/39, 41, 38; 365/189.02, 189.08

(56) References Cited

U.S. PATENT DOCUMENTS

| | | | |
|---|---|---|---|
| 4,878,200 | * 10/1989 | Asghar et al. | 365/189.02 |
| 5,450,608 | * 9/1995 | Steele | 395/800 |
| 5,789,939 | * 8/1998 | Agrawal et al. | 326/41 |
| 5,969,539 | * 10/1999 | Veytsman et al. | 326/39 |

* cited by examiner

*Primary Examiner*—Son Mai
(74) *Attorney, Agent, or Firm*—Christopher P. Maiorana, P.C.

(57) ABSTRACT

A product-term allocation architecture for a programmable device, comprising a plurality of logic gate sections and a fully rotatable, programmable OR-type array. A first one of the logic gate sections may comprise a first plurality of fixed logic gates. Each of the first plurality of fixed logic gates may have m inputs, m being an integer of at least one. A second one of the logic gate sections may comprise a second plurality of fixed logic gates. Each of the second plurality of fixed logic gates having n inputs, n being an integer of at least two and being different from m. The plurality of logic gate sections may be configured to provide p outputs, p being an integer equal to or greater than the total number of the fixed logic gates and less than the total number of fixed logic gate inputs. The fully rotatable, programmable OR-type array may receive the p outputs and may be configured to generate a plurality of array outputs.

14 Claims, 8 Drawing Sheets

METHOD, ARCHITECTURE AND CIRCUIT FOR PRODUCT TERM ALLOCATION

This application claims the benefit of U.S. Provisional Application No. 60/093,742, filed Jul. 21, 1998.

SUMMARY

The present invention concerns a product term allocation scheme that allows flexibility in the routing of logic signals and/or placement of logic equations in the macrocells of a logic block, similar to that of a programmable logic array (PLA), with a reduced amount of circuitry.

DISCUSSION OF THE BACKGROUND

Current complex programmable logic device (CPLD) product term allocation schemes tend to restrict allocation of product terms to macrocells within a logic block Likewise, placement of logic equations in the macrocells of a logic block is also restricted. To allow for unrestricted allocation-of product terms and placement of logic equations in macrocells, a PLA (Programmable Logic Array) structure may be used. However, in a CPLD, a PLA structure is very costly in both die area and performance.

The main disadvantage of current product term allocation methods is once logic equations are partitioned into a logic block, the macrocells that the logic equations can be placed into are restricted. Logic and/or signal placement software must take into account the distribution of product terms among the logic equations and the sharing of product terms across multiple logic equations. These restrictions can be a problem when attempting to retain fixed pinouts (e.g., input and output signal definitions) after changes are made to an existing design. Since input/output (I/O) cells are connected directly to macrocells in the logic block, logic changes can create a logic block partition that is a legal partition, but will not support the fixed pinout due to the placement restrictions imposed by product term allocation.

The traditional OR array structure typically found in programmable logic arrays allow any product term in the product term array to be steered to and shared by any of the macrocells in a logic block. For most CPLD designs, however, a product term allocation scheme that can allocate on the granularity of a single product term is not needed. The present invention takes advantage of this fact and creates a PLA-type OR structure that steers and shares groups of product terms instead of single product terms.

BRIEF DESCRIPTION OF THE DRAWINGS

These and other objects, features and advantages of the present invention will be apparent from the following detailed description and the appended claims and drawings in which:

DETAILED DESCRIPTION OF THE PRESENT INVENTION

Figure 1A:
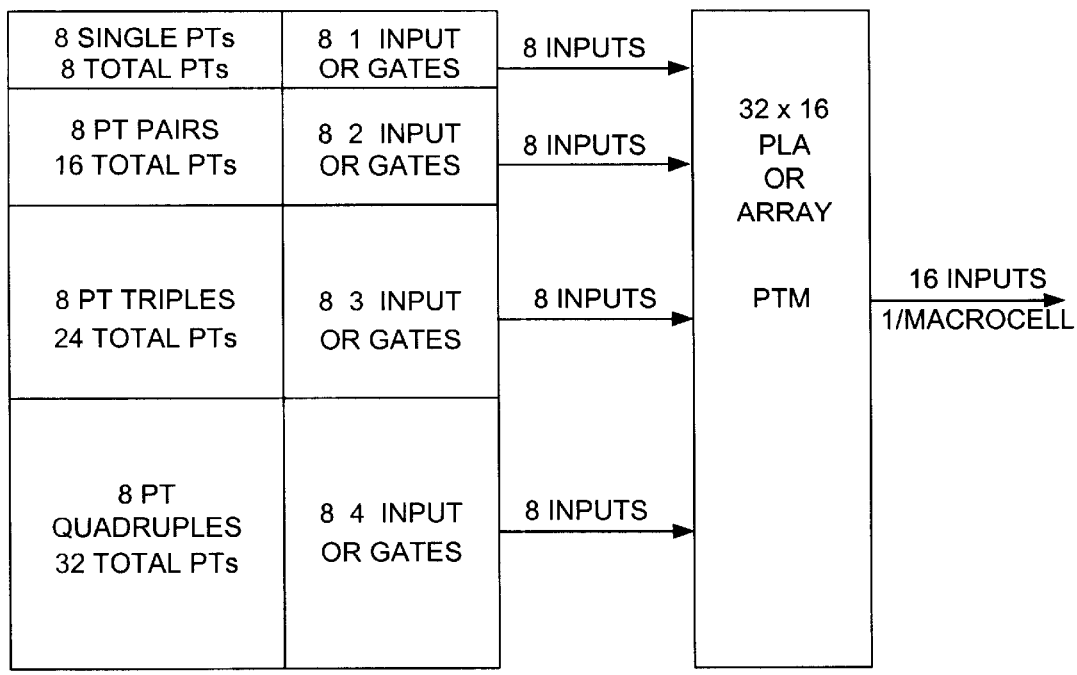
FIG. 1(A) is a diagram of a preferred embodiment of the present invention.
Figure 1B:
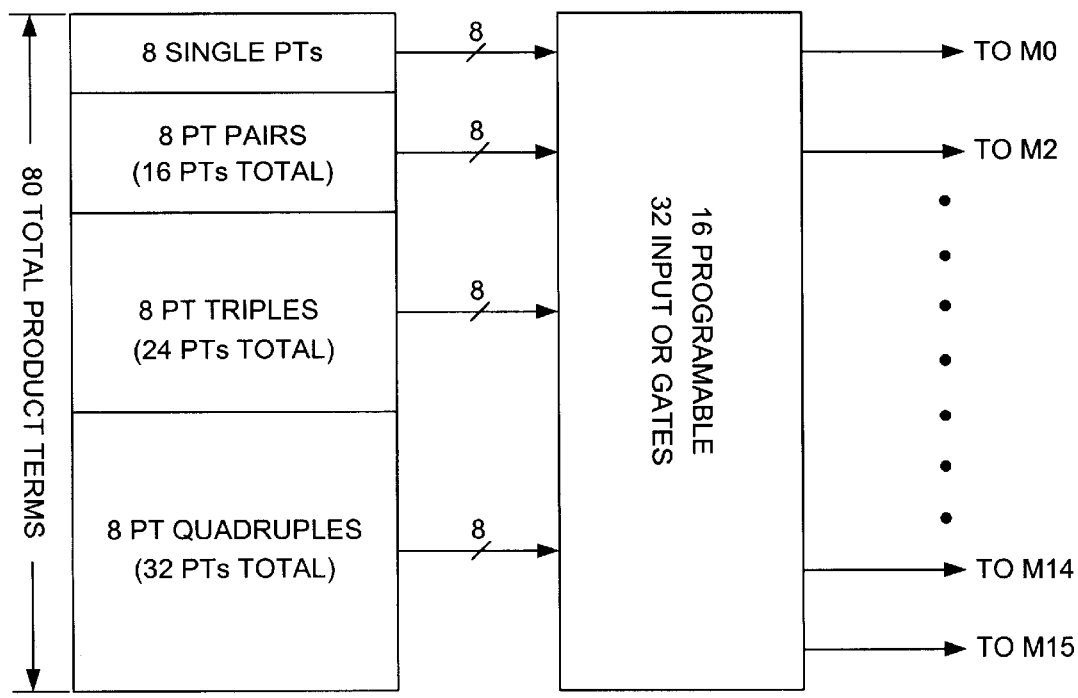
FIG. 1(B) is a diagram of an alternative architecture of FIG. 1(A)

To describe the details of the operation of the proposed product term allocation scheme, we may assume that the allocation architecture and circuit comprise an AND array having, for example, 80 general purpose product terms (PTs) and a logic block containing, for example, 16 macrocells (see FIGS. 1(A)–(B)). However, the AND array may have any number of product terms (e.g., at least 12, preferably at least 20, more preferably at least 40, and even more preferably at least 64), the logic block may contain any number of macrocells (e.g., at least 2, preferably at least 4, more preferably at least 6), and the maximum number of PTs per macrocell may also be any number (e.g., 8, preferably 12, more preferably 16). In addition, the plurality of AND gates in the AND array may be arbitrarily segregated into any appropriate number of groups, as will be explained hereunder. Now, consider the block diagram of the AND/OR array combination shown in FIG. 1(A).

In the example of FIG. 1(A), the AND array consists of 4 sections, each having 8 groups of product terms that vary from a single product term up to a group of 4 product terms. The number of AND array sections, AND gates and AND gate inputs may vary according to design. Preferably, the number of AND gate sections is at least 2, more preferably at least 3 and even more preferably at least 4. The number of AND gates in each AND array section may also vary according to design. Preferably, the number of AND gates in each section ranges from 1 to 16. more preferably from 2 to 12, and even more preferably from 2 to 8. The number of inputs to each AND gate may also vary. Preferably, the number of inputs is an integer of from 1 to 16, more preferably from 1 to 12, and even more preferably from 1 to 8. In the embodiment shown in FIG. 1(A), the number of AND gate sections depends on the variance in the number of product terms input into the AND gates. For relatively small arrays (e.g., where the total number of sates $\leq 16$), or where optimal speed is not an overriding concern, one may also substitute a NAND gate array for the AND array. The output of each NAND gate may, independently, be inverted by an inverter to provide or select a desired signal polarity.

These groups also each have a number of OR logic gates with a fixed number of inputs. The outputs of these fixed ORs may be inputs to a fill PLA-type OR array for a product term matrix (PTM). In the example of FIG. 1(A), the OR array has a 32×16 size.

The PLA-type OR array may comprise a plurality of programmable, multiple-input OR gates. The number of OR gates and inputs thereto may vary according to design, but preferably, is at least 4, more preferably at least 8 and even more preferably at least 12. The number "p" of OR gates may depend on the number "q" of macrocells, where p and q may be integers in a ratio of from 8:1 to 1:8, preferably from 4:1 to 1:4, and more preferably from 2:1 to 1:2. In an even more preferred embodiment, the number of programmable OR gates equals the number of macrocells (p:q=1:1).

The number of inputs to each OR gate may also vary. In the example of FIG. 1(A), the OR array has 16 gates, each having 32 inputs. For relatively small arrays (e.g., where the number of gates ≦8), or where optimal speed is not an overriding concern, one may also substitute a NOR gate array for the OR array. The output of each NOR gate may, independently, be inverted by an inverter to provide or select a desired signal polarity.

In one embodiment, true and complement of the inputs to the AND-OR array are available. Consequently, such an AND-OR array may be replaced by a NAND-NAND, OR-NAND or NOR-OR array without affecting the polarity of the macrocell input signal(s).

In FIG. 1(A), each of the 16 outputs from the OR gates are inputs to one of the 16 macrocells in the logic block. The product term allocation scheme is not restricted to the number of sections and/or groups described above. Any number of different combinations of fixed groups of product terms and OR array sizes can be implemented. The scheme is also not restricted to 80 product terms and 16 macrocells. The following are examples of some alternate implementations of the product term allocation scheme. These variations list the number of product terms in the product term array and the number of inputs generated for the programmable OR array. Each of these variations can be used with any number of macrocells per logic block by simply implementing the desired number of outputs of the programmable OR's.

TABLE 1

Allocation scheme variations.

| Variation: | 1 | 2 | 3 | 4 | 5 | 6 | 7 | 8 |
|---|---|---|---|---|---|---|---|---|
| Total PLA inputs | 32 | 16 | 16 | 16 | 18 | 16 | 16 | 22 |
| Total product terms | 80 | 56 | 80 | 60 | 80 | 72 | 80 | 124 |
| Fixed OR table: | | | | | | | | |
| 1 input OR gates | 8 | — | — | 4 | 4 | — | — | 4 |
| 2 input OR gates | 8 | 4 | 4 | 4 | 4 | — | — | 4 |
| 3 input OR gates | 8 | 4 | — | — | — | 4 | — | 4 |
| 4 input OR gates | 8 | 4 | 4 | 4 | 4 | 4 | — | — |
| 5 input OR gates | — | 4 | — | — | — | 4 | 16 | — |
| 6 input OR gates | — | — | 4 | — | — | 4 | — | — |
| 8 input OR gates | — | — | 4 | 4 | 4 | — | — | — |
| 10 input OR gates | — | — | — | — | 2 | — | — | 10 |

One advantageous feature of the present product term allocation scheme is the grouping of product terms into fixed size OR gates to reduce the number of inputs to the OR plane of the AND/OR array as compared to a traditional PLA. Devices can use this product term allocation scheme to greatly increase the capability of maintaining fixed pinouts of designs (e.g., subsequent designs for improved and/or replacement parts can keep the same pin definitions as the parts being improved upon or replaced). This also has the effect of simplifying the fitting software for placement and routing of logic equations within a logic block.

Advantages of the Present Invention

The proposed product term allocation scheme has the following advantages over prior schemes:

Once a legal partition of the design into a logic block is determined by software, the logic equations can be placed in any macrocell without restrictions. This greatly enhances the ability to fix pins in a design.

The width of the OR array for any given macrocell can be any width, including a width equal to all of the product terms in the product term array.

Fixed product term groups can be steered to and shared by all macrocells in the logic block.

One may obtain the full PT routability of the PLA architecture with up to 60% fewer configuration bits.

Alternate Implementation

A traditional PLA AND/OR structure would provide the same advantages as the proposed product term allocation scheme, but may increase the die area dedicated thereto and decrease the performance.

EXAMPLE 1

In the process of defining the present product term allocation scheme (also identifiable as a product term matrix, or PTM), PTM simulation software was created (see Example 3 below) for an example of the present PTM scheme (Variation #1 above), as well as for an existing scheme shown in Table 4 below. A number of assumptions are applicable:

The simulators are essentially routers for each of the PTMs. However, they were optimized for obtaining a valid route, rather than for software performance. This simplification focuses on the utilization and routability of the PTM so that the PTM routing phase in the fitting process could be separately optimized.

The simulator compile times reflect how long it took the unoptimized simulation software to route the designs, rather than how long a production worthy fitter took to route the designs.

Table 2 shows the compile times for both Variation 1 of the present PTM (see Table 1 above) and an existing PTM for three separate simulations. For the specific details of the vectors and setup of the simulations, refer to Example 3 below.

TABLE 2

CPU simulation times for each PTM.

| Simulation No. | Variation 1 Compile Time (hh:mm:ss) | Existing PTM Compile Time (hh:mm:ss) | % Difference [([existing time - Var. 1 time)/ Var. 1 time] × 100%) |
|---|---|---|---|
| 1 | 00:03:22 | 01:36:39 | 2860 |
| 2 | 00:52:32 | 04:12:00 | 380 |
| 3 | 01:25:26 | 05:53:25 | 314 |

Table 2 shows that the present PTM is actually much faster to route in software than the existing PTM based on the routing algorithms described in Example 3. The explanation for this is quite simple.

The algorithm that is used to route the existing PTM must go through an iterative process that has two steps. In the first step, the algorithm must assign the equations that have been partitioned into the logic block to specific macrocells. Once this assignment has been made, the algorithm can then attempt to allocate the product terms to the macrocells. If the allocation fails, a new equation placement must be made and the allocation process starts again. These two steps are performed until a valid route is found, or until the algorithm determines that a route is not possible.

By contrast, the routing algorithm for the present PTM only has one step to perform and that is the allocation of the product terms to the equations. Once a valid allocation is found, the equations can be placed into any macrocell that the fitter desires. This made the compile times of the present PTM scheme much faster.

However, even if production-worthy routing algorithms favored the existing PTM for the compile times, there is still a potential benefit in the overall compile time for the entire device. For example, let's assume for simplicity that the global routing software code can choose to route four signals from fixed macrocells in each logic block. A logic block partition that has four equations to be routed globally must confirm that the desired equations can be placed into macrocells that can be routed globally. This confirmation procedure can be very time consuming in the global routing process. In the present PTM scheme, however, the global routing software code does not have to confirm that the equations can be placed in globally routable macrocells since the equations can be placed in any macrocell.

EXAMPLE 2

Table 3 shows the total number of configuration bits for several different PTM schemes. For purposes of direct comparison, the GLB structure shown on p. 2–6 of the Lattice 1994 Data Book and/or the Lattice 1994 Handbook (published by Lattice Semiconductor Corp., Hillsboro. Oreg.) was replicated four times to provide a total of 16 macrocell inputs. This results in 8 4-input input OR gates, 4 5-input OR gates, 4 7-input OR gates, a total of 80 Product Terms and a total of 16 inputs to the programmable OR structure, for the 16 macrocell inputs. This "extended Lattice" scheme is thus as directly analogous to Variation 1 of the present scheme as it can be, given the constraints of the published structure. Although the number of configuration bits for the extended Lattice scheme is less than the present PTM scheme, the routability is not nearly as good as the present scheme.

TABLE 3

Configuration bit requirements of each PTM scheme.

| PTM Scheme | Configuration Bits | % Change relative to "Extended Lattice" PTM |
|---|---|---|
| Extended Lattice PTM | 256 | — |
| "Existing PTM" of Example 1 | 192 | −25% |
| Fully routable PLA | 1280 | 400% |
| Variation 1 (present invention) | 512 | 100% |

Even though the number of configuration bits for the present scheme is larger than that of the existing scheme of Example 1, a savings in the number of configuration bits for global routing may be possible by using the present PTM. Since equations can be placed into any macrocell within a logic block, the size of a programmable interconnect matrix (PTM) connecting macrocells in a logic block cluster to the global routing lines could be reduced. This savings may be quantified using software to simulate the routability of each global routing scheme.

EXAMPLE 3

The objective of this example is to describe the PTM simulations that were used in Example 1 to help determine the impact of the present PTM architecture on routing and routing software. This example covers each of several PTM architectures in detail, as well as the details of the PTM simulators and the results of the simulations.

Concerns about the "existing PTM" of Example 1 include the fact that it is not "fitter friendly" and the fitting algorithm is not very deterministic. As a result, for this PTM, the condition wherein a logic block partition does not violate the available resources for a logic block does not guarantee that a valid fit for the partition exists. This requires the global partitioner to allow the detailed router to check the routing of the PTM to ensure that the partition is indeed valid. This detailed routing of the PTM equates to around 80% of the overall fitting time for this PTM. As the number of logic blocks becomes larger (e.g., in subsequent devices), many more logic block partitions will have to be analyzed to find a fit for the design. This will equate to an enormous overall fitting time since the global partitioner will be forced to do detailed routing for each of these logic block partitions. This will result in an unacceptable fitting time for many larger devices (e.g., having at least 64, 128, 192 or more total macrocells).

The goal in this example is to determine the overall fitting capability of various PTM architectures. A PTM scheme should be flexible enough to guarantee that for given numbers of input signals, product terms and output signals that do not exceed some maximum value, a fit will always be found within a logic block. However, one may consider other evaluation metrics in designing a new PTM, such as:

Speed:
    Product term routing distance
    Number of different timing paths

Layout Size:
    Number of configuration bits
    Aspect ratio of the architecture
    Routing congestion created by product term routing distance Ease of Use:
    % fitting success for given partition criteria
    Deterministic nature of fitting
    CPU time to fit
    Macrocell "locking" capability
    Number of different timing paths (if >1, then a timing driven place-and-route fitting solution should be used for routing signals in the architecture)

Once the metrics for evaluating each PTM architecture were understood, a method for determining the performance of each PTM architecture for each metric was developed. The general idea was to create PTM simulators that would simulate the fitting process for each architecture and then gather simulation data to compare each architecture. The first step was to create a program that generates logic block partitions that could be used by each PTM simulator as vectors for each simulation cycle. Each simulation cycle simply attempted to fit a given logic block partition using the PTM. Next, a simulator was written for each of the PTM architectures as well as the existing PTM of Example 1 above. Finally, simulations were run for each of the PTM architectures and the simulation data was gathered to determine how well each performed. Specific details of the simulators are presented later.

PTM ARCHITECTURES

Each of the present PTM architectures are presented below as well as an overview of the existing PTM for completeness A brief discussion of the perceived problems with the existing PTM is also included.

Existing PTM:

Table 4 shows the existing PTM architecture of Example 1. There are 80 total product terms, and a maximum of 16 product terms per OR. A total of 192 configuration bits is required. Most of the center product terms in the existing PTM can be steered to or shared by up to 4 adjacent macrocells. Product terms at the boundaries of the PTM are reduced in the number of adjacent macrocells that can utilize these product terms for steering and sharing.

The fact that the existing PTM is not homogenous across each product term is a problem for the fitting algorithms. While some of the product terms can be steered to or shared by 4 adjacent macrocells, some can only be steered to or shared by 3, 2 or even only a single macrocell. Also, as seen in Table 4, some of the product terms are steered or shared in pairs. This often results in an isolated product term that cannot be used by any other macrocell.

2 in Table I above). This results in changing the output PLA OR structure to 16 inputs by 16 sums instead of the 32 inputs by 16 sums in Variation #1, thereby reducing the number of configuration bits in the PTM by 50%. The important feature to remember about this PTM architecture is the fact that every product term, although it may be in a group of product terms, can be steered to or shared by every macrocell. This will allow equations placed in logic blocks with this type of

TABLE 4

Existing PTM Architecture (S = single, P = pair, M = macrocell).

```
      PT#    1111111111222222222233333333334444444444555555555566666666667777777777
      0123456789012345678901234567890123456789012345678901234567890123456789

MD    PPSSPPSSPPSSPPSS
MD1       SSPPSSPPSSPPSSPP
MD2           SSPPSSPPSSPPSSPP
MD3               SSPPSSPPSSPPSSPP
MD4                   SSPPSSPPSSPPSSPP
MD5                       SSPPSSPPSSPPSSPP
MD6                           SSPPSSPPSSPPSSPP
MD7                               SSPPSSPPSSPPSSPP
MD8                                   SSPPSSPPSSPPSSPP
MD9                                       SSPPSSPPSSPPSSPP
MD10                                          SSPPSSPPSSPPSSPP
MD11                                              SSPPSSPPSSPPSSPP
MD12                                                  SSPPSSPPSSPPSSPP
MD13                                                      SSPPSSPPSSPPSSPP
MD14                                                          SSPPSSPPSSPPSSPP
MD15                                                                  PPSSPPSSPPSSPPSS
```

Alternate #1

Figure 2:
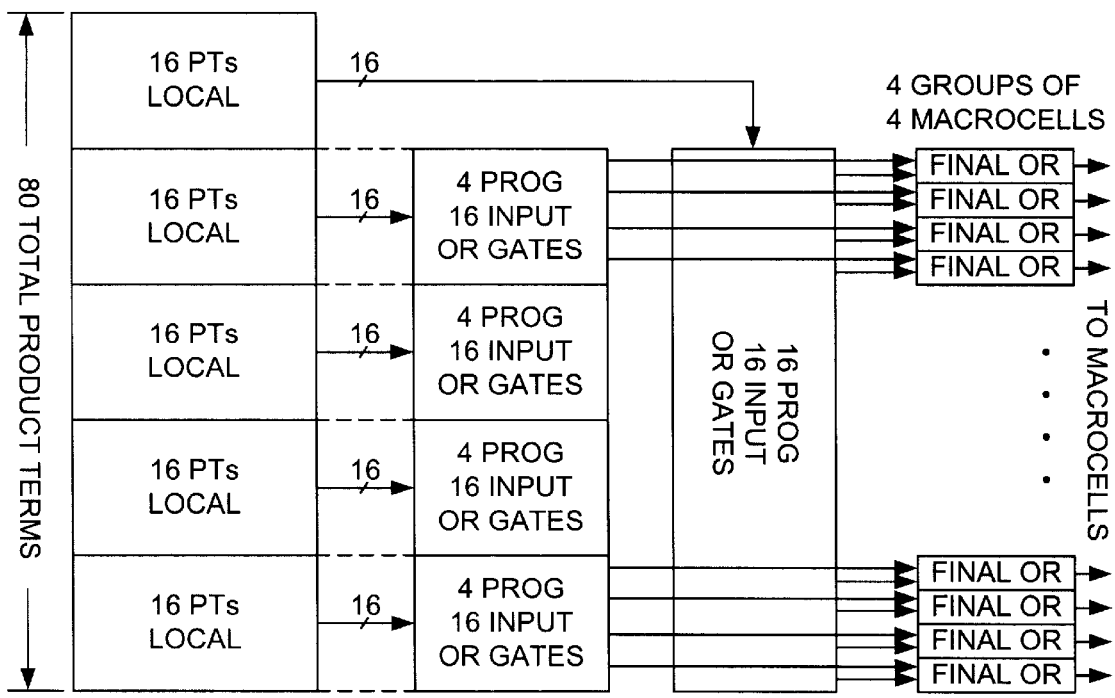
FIG. 2 is a diagram of an alternative architecture of FIG. 1(A)
Figure 3:
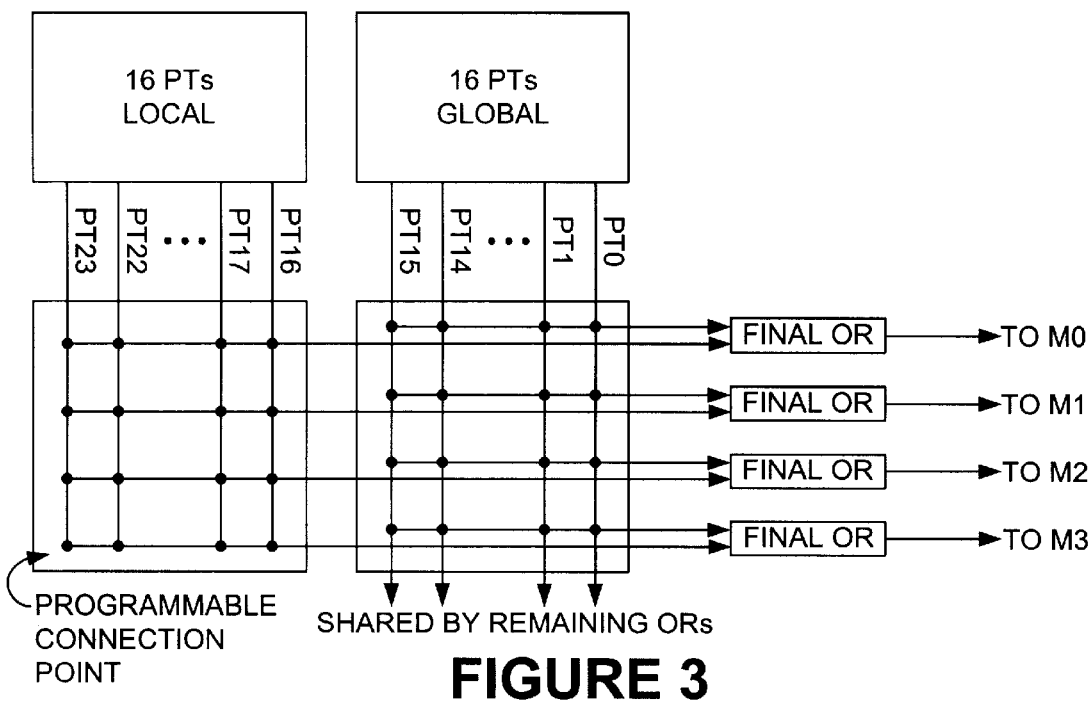
FIG. 3 is a diagram of an OR-gate structure that may be used in FIGS. 1(A), 1(B) and 2.

FIG. 2 shows an alternate PTM architecture ("Alternate #1"). Alternate #1 consists of 4 parallel full PLA arrays with each array having 16 product terms by 4 sum terms for a total of 64 product terms. It also has 1 parallel global full PLA consiting of 16 product terms by 16 sum terms. This equates to a total of 80 product terms. Each macrocell sum term is the sum of one of the "quad" sum terms associated with the group of 4 macrocells, and one global sum term. FIG. 3 shows a detailed view of the programmable OR gates for one of the quad arrays and the global PTs, and how the sum terms are programmably routed to the 4 macrocells associated with the one quad array. Alternate #1 requires 512 configuration bits for proper operation.

Variation #1

FIG. 1(B) is a block diagram of the PTM architecture identified above as "Variation #1". Variation #1 has a total of 80 product terms that are divided into 4 groups with each group having a fixed width OR. There are 8 single product terms, 8 product term pairs, 8 product term triples and 8 product term quadruples. Each of these 4 groups of OR gates has 8 outputs for a total of 32 outputs. These 32 outputs are used as inputs to a PLA type OR structure that has 32 inputs and 16 programmable OR gates, where each OR gate is up to 32 inputs wide. The PLA type OR structure allows any of the fixed width OR gates to be used by any of the 16 macrocells in the logic block. Therefore, the OR gate for any macrocell can be up to 80 product terms wide. This architecture uses 512 configuration bits for routing operations.

Further (but similar) alternatives to Variation #1 could be defined by simply changing how the 80 product terms are grouped into fixed width OR gates. For example, another version of Variation #1 might consist of 4 groups of fixed width OR gates with each group having only 4 outputs instead of 8. Each group of fixed width OR gates could then have 2, 4, 6 and 8 input OR gates, respectively (see Variation #2 in Table I above). This results in changing the output PLA OR structure to 16 inputs by 16 sums instead of the 32 inputs by 16 sums in Variation #1, thereby reducing the number of configuration bits in the PTM by 50%. The important feature to remember about this PTM architecture is the fact that every product term, although it may be in a group of product terms, can be steered to or shared by every macrocell. This will allow equations placed in logic blocks with this type of PTM to ignore macrocell placement restrictions, since any group of fixed width OR gates can be steered to or shared by any macrocell.

Variation #2

Table 5 below shows a diagram of another alternate PTM architecture ("Variation #2," an example of the product term allocation scheme described in U.S. Patent application Ser. No. 08/946,030, filed on Oct. 7, 1997, the relevant portions of which are incorporated herein by reference in its entirety). Product term pairs are not present in Variation #2. Therefore, each product term can be steered or shared individually. Each macrocell can OR together up to 20 product terms. Each product term can be steered to and shared by 4 adjacent macrocells, regardless of the position of the product term in the array. This creates a PTM that is homogenous and circular in nature.

Due to the circular nature of Variation #2, once a valid fit for the logic block partition has been determined, the position of the equations can be rotated through the logic block. The relative placement of each equation to the other equation(s) may remain the same, regardless of the absolute placement. This allows any one equation to be rotated so that it occupies any of the desired macrocells, although the other equations preferably remain in their relative positions. Variation #2 consumes 320 configuration bits in an 80-input, 16-macrocell architecture. The reason for choosing 20 product terms per OR in Variation #2 was due to certain combinations of (a) total number of product terms, (b) number of product terms per macrocell and (c) shift factor to the start of the next macrocell may be optimal and/or valid for this PTM architecture. These optimal values provide a steering and sharing value that is the same for each product term in the array in order to render the PTM architecture homogenous across all macrocells. Some combinations of total product terms, number of product terms per macrocell and shift factor to the start of the next macrocell may result in a varying number of macrocells sharing each product term, which is non-homogeneous and not necessarily optimal for this architecture.

every design analyzed, about 26% of the equations were single product term equations, 21% of the equations consisted of 2 product terms, etc.

TABLE 5

Variation #2 architecture.

```
PT#        1111111111222222222233333333334444444444555555555566666666667777777777
  0123456789012345678901234567890123456789012345678901234567890123456789012345678 9
MD    SSSSSSSSSSSSSSSSSSSS
MD1       SSSSSSSSSSSSSSSSSSSSS
MD2           SSSSSSSSSSSSSSSSSSSSS
MD3    |----|    SSSSSSSSSSSSSSSSSSSSS
MD4    |----|        SSSSSSSSSSSSSSSSSSSSS
MD5    shift factor of 5    SSSSSSSSSSSSSSSSSSSSS
MD6    product items            SSSSSSSSSSSSSSSSSSSSS
MD7                                 SSSSSSSSSSSSSSSSSSSSS
MD8                                     SSSSSSSSSSSSSSSSSSSSS
MD9                                         SSSSSSSSSSSSSSSSSSSSS
MD10                                            SSSSSSSSSSSSSSSSSSSSS
MD11                                                SSSSSSSSSSSSSSSSSSSSS
MD12                                                    SSSSSSSSSSSSSSSSSSSSS
MD13   SSSSS                                                SSSSSSSSSSSSSSSS
MD14   SSSSSSSSSS                                                SSSSSSSSSS
MD15   SSSSSSSSSSSSSSS                                                SSSSS
```

Table 6 shows some alternative patterns for architectures similar to Variation #2.

TABLE 6

Variation #2 alternatives.

| Max PTs | PTs Per Macro | Shift Factor | Max Steer/Share |
|---------|---------------|--------------|------------------|
| 80 | 15 | 5 | 3 |
| 80 | 20 | 5 | 4 |
| 80 | 25 | 5 | 5 |
| 80 | 30 | 5 | 6 |
| 64 | 16 | 4 | 4 |
| 64 | 20 | 4 | 5 |
| 64 | 24 | 4 | 6 |
| 64 | 28 | 4 | 7 |
| 64 | 32 | 4 | 8 |
| 48 | 12 | 3 | 5 |
| 48 | 15 | 3 | 6 |
| 48 | 18 | 3 | 7 |
| 48 | 21 | 3 | 8 |
| 48 | 24 | 3 | 9 |
| 48 | 17 | 3 | 10 |

Simulator Creation

Simulator creation for the PTM architectures was divided into two major areas. First, a partition generator was written to generate sample logic block partitions that could be used as input(s) to a specific PTM architecture simulator. Next, a simulator was created specifically for each of the PTM architectures.

Partition Generator

Figure 4:
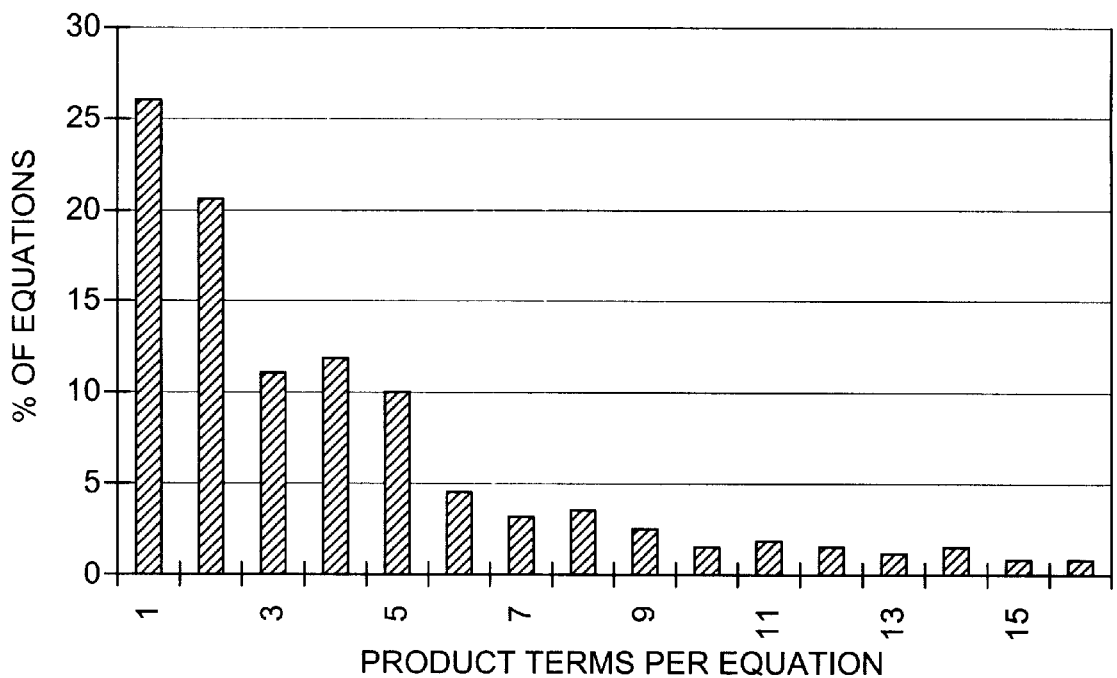
FIG. 4 is a diagram of a product term distribution of a partition generator that may be used in FIGS. 1(A), 1(B) and 2.
Figure 5A:
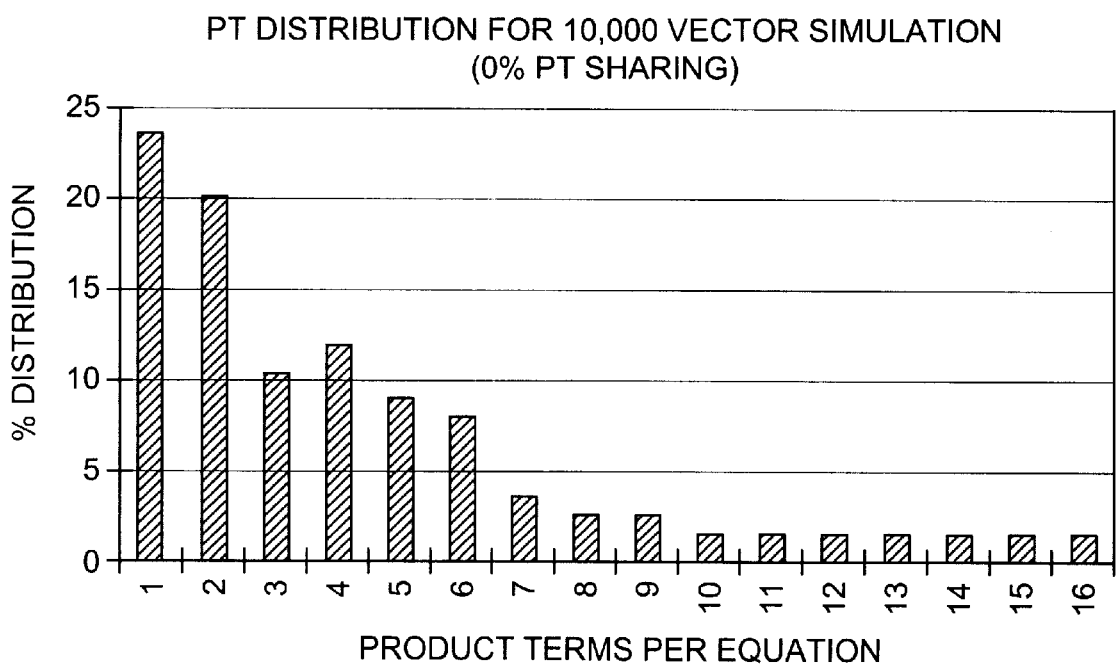
FIGS. 5(A)–5(B) are diagrams of an example simulation of FIGS. 1(A), 1(B) and 2.
Figure 5B:
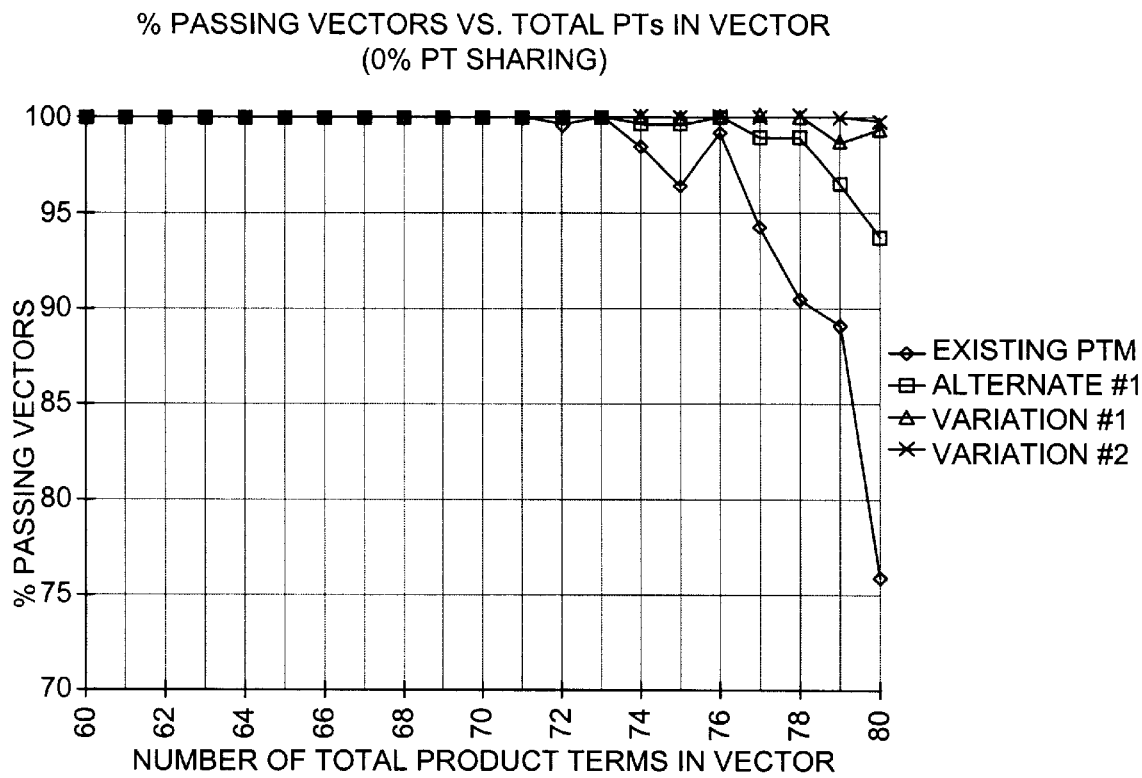
Figure 6A:
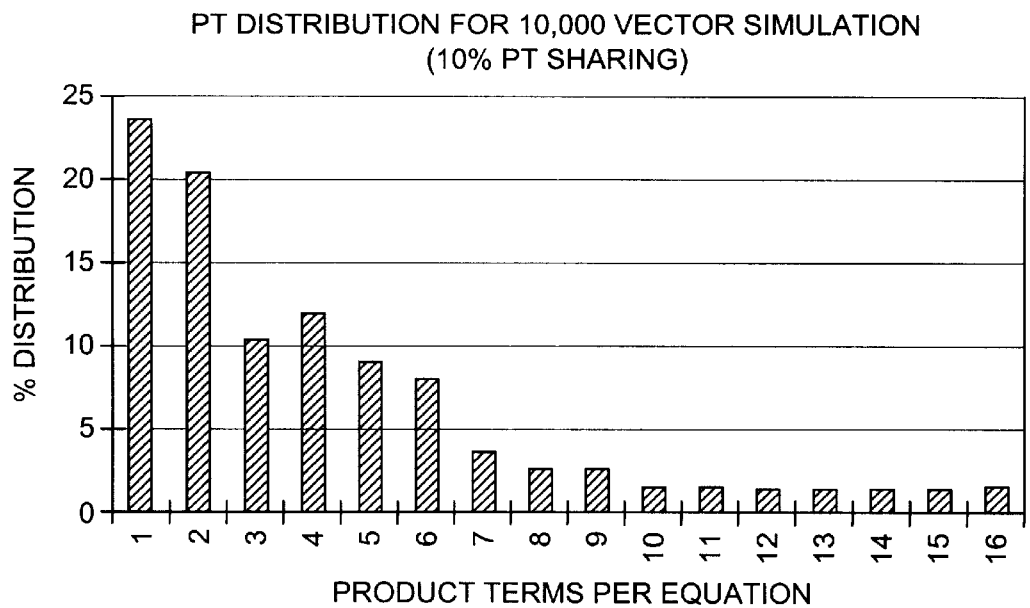
FIGS. 6(A)–6(C) are diagrams of another example simulation of FIGS. 1(A), 1(B) and 2.
Figure 6B:
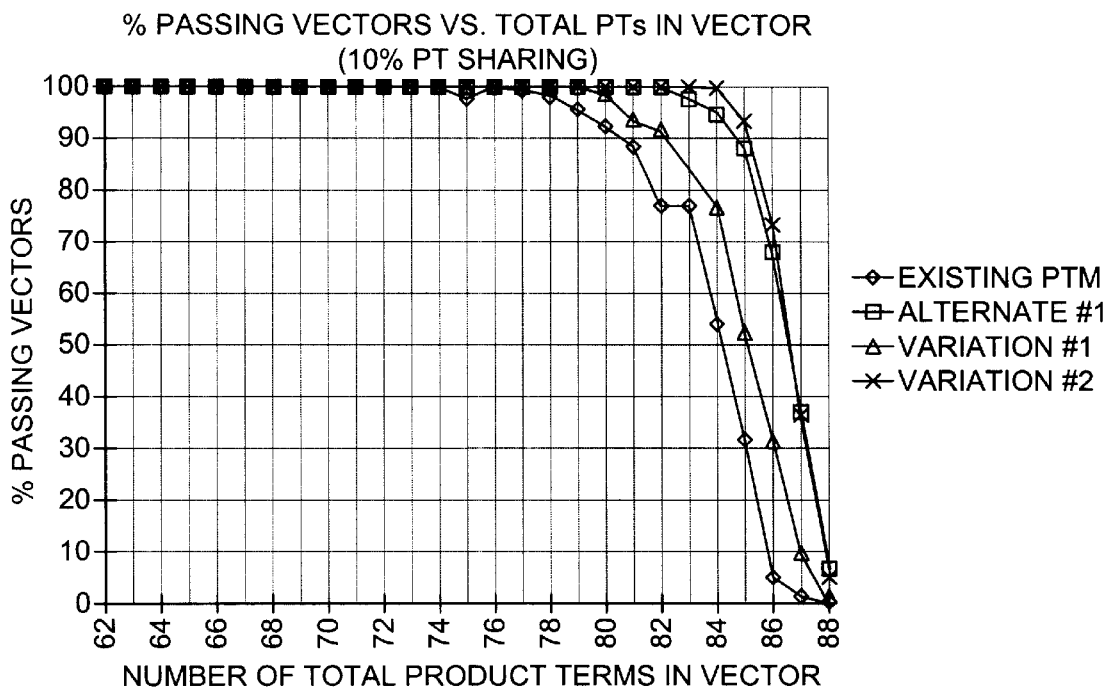
Figure 6C:
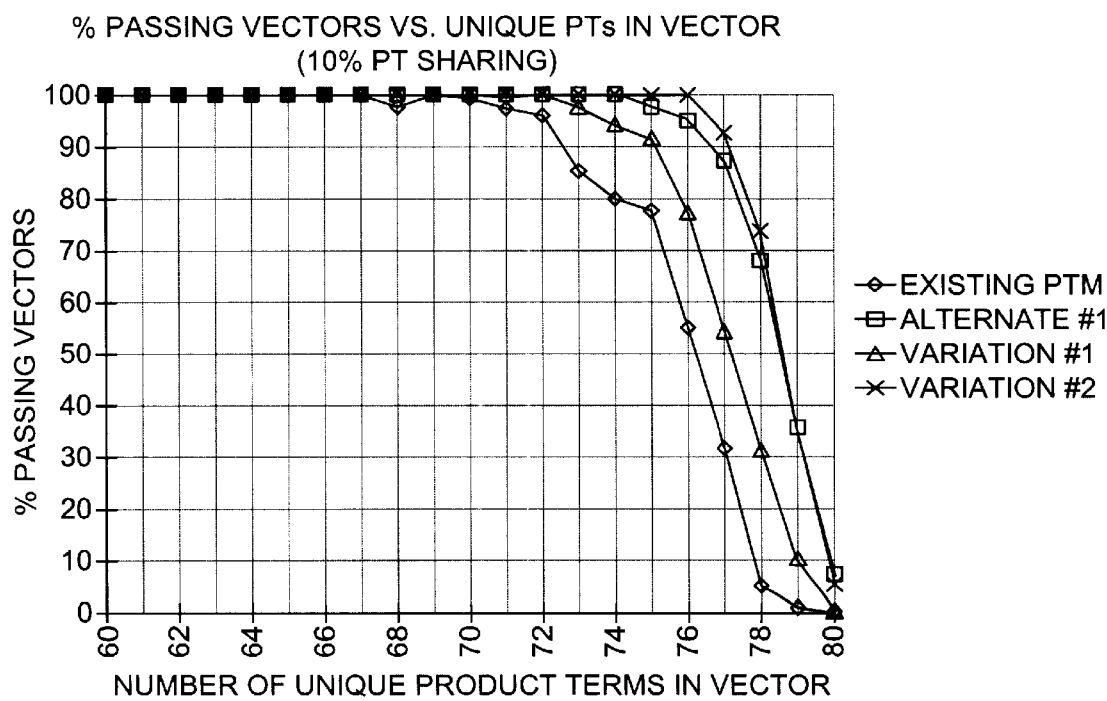
Figure 7A:
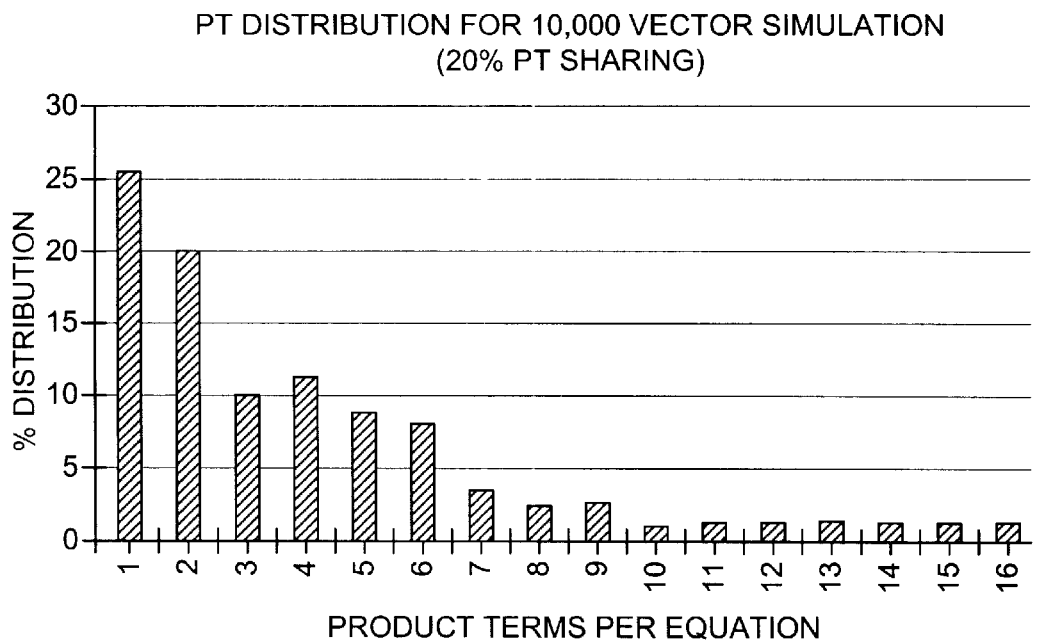
FIGS. 7(A)–7(C) are diagrams of another example simulation of FIGS. 1(A), 1(B) and 2.
Figure 7B:
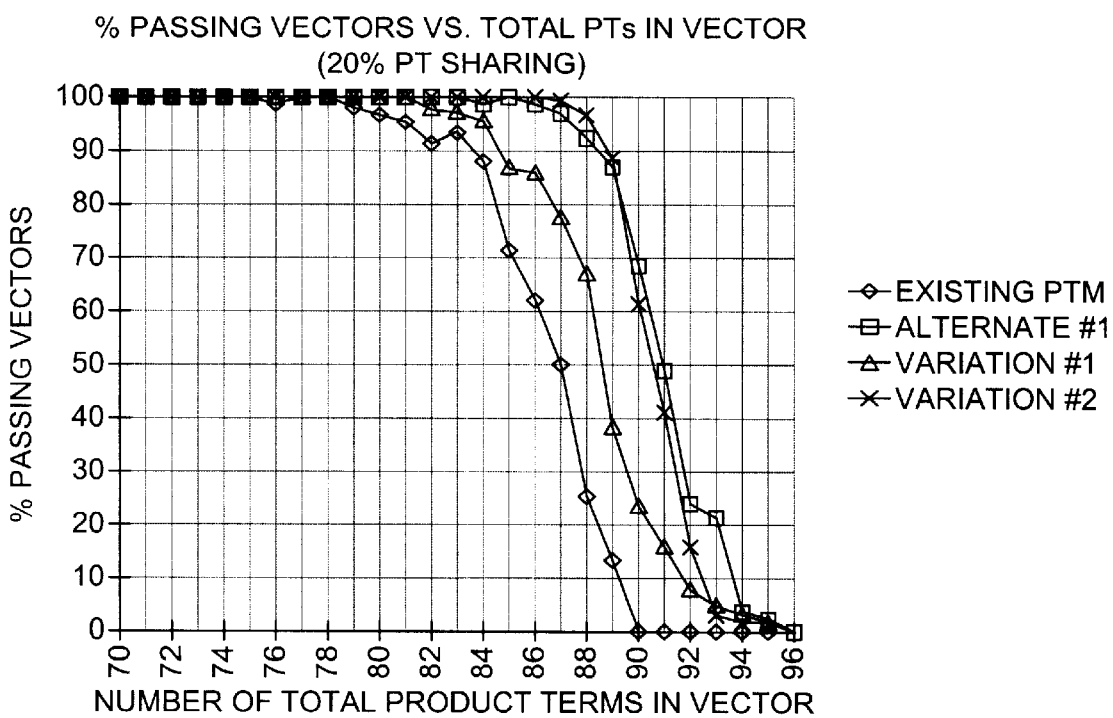
Figure 7C:
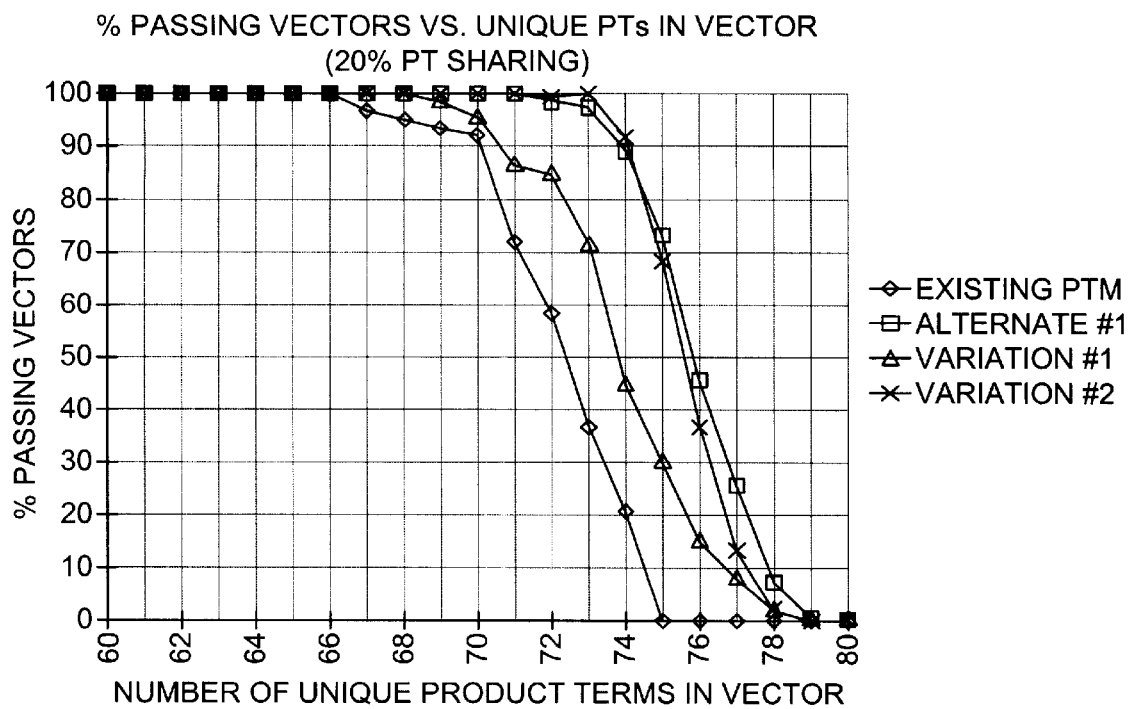
Figure 8A:
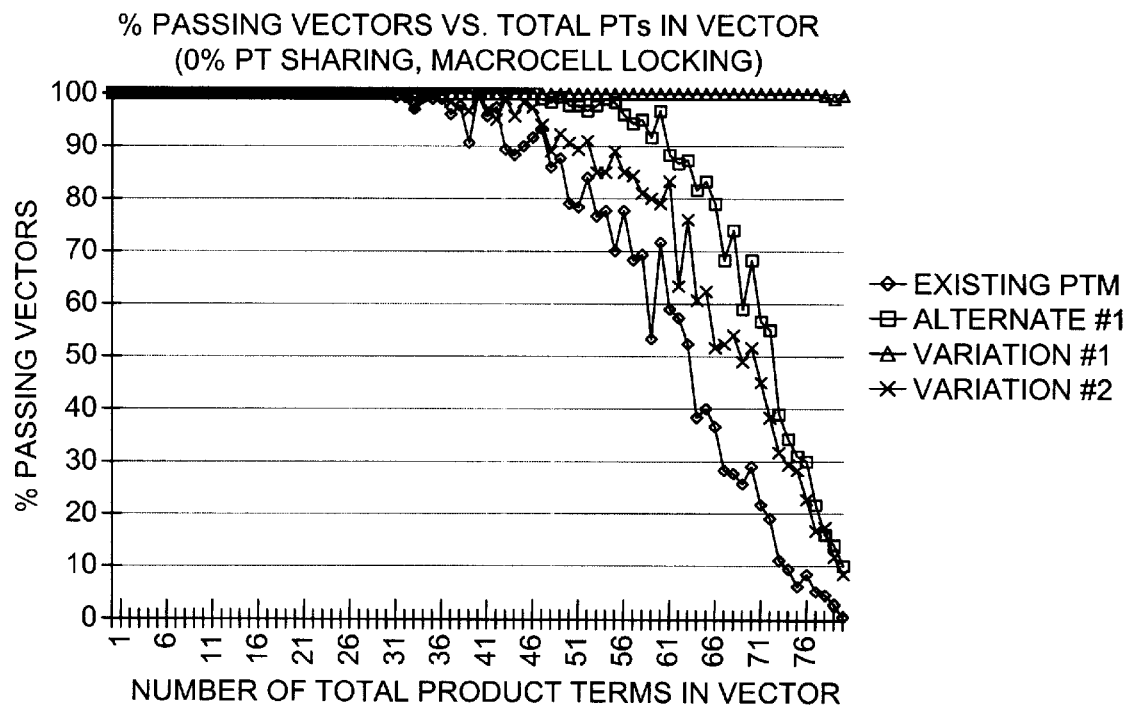
FIGS. 8(A)–8(C) are diagrams of another example simulation of FIGS. 1(A), 1(B) and 2.
Figure 8B:
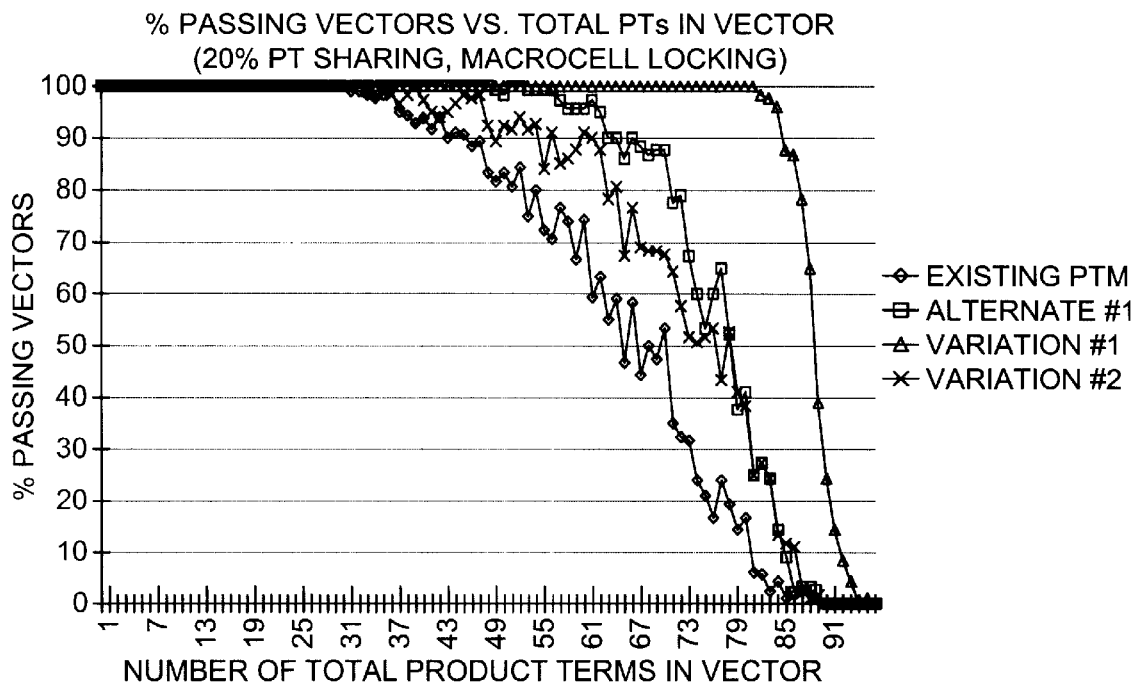
Figure 8C:
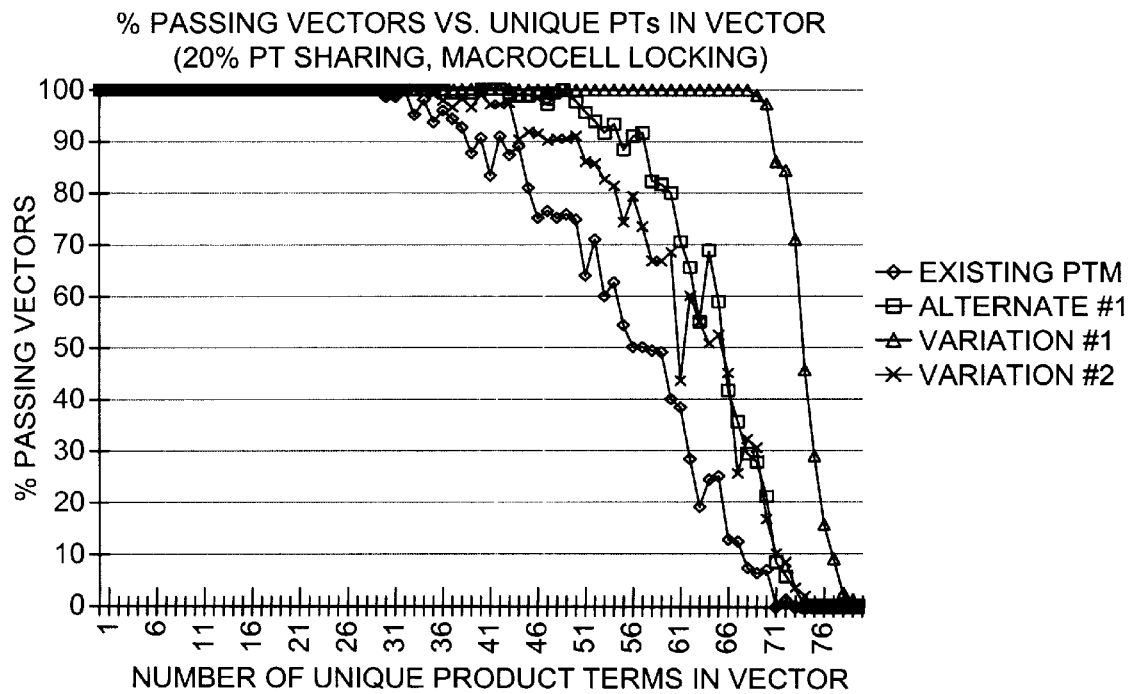

The partition generator generates a set of equations and a set of product terms for each equation to emulate a logic block partition First, a random number of equations were generated to represent the number of equations for the logic block partition. Next, for each equation, a pseudo random number of product terms were generated. The number of product terms generated for each equation was based upon a product term distribution for a number of actual circuit designs. FIG. 4 is a graph of this product term distribution. This graph indicates that out of every equation analyzed in The partition generator was written to generate a product term distribution that, over several thousand cycles, would match this distribution. If the partition generator produces a product term distribution that matches a distribution derived from actual designs, it is believed that the vectors created in this Example for the PTM simulators would more closely represent actual design data. This distribution can easily be changed within the simulation software to match any distribution based on different data, such as new designs developed in the future. Also, the total number of product terms in the logic block partition generator, as well as the total number of macrocells, may be parameterized so that they can be changed to any desired value for evaluation of other PTM architectures.

The partition generator also produces partitions that have some amount of product term sharing. The user may specify the percentage product term sharing for each simulation on the command line of the simulator. For example, if the user specifies 10% product term sharing for a partition with a total of 80 unique product terms, the logic block partition may allocate up to 88 total product terms to the equations, but no more than 80 unique product terms. Therefore, up to 8 product terms might be shared if 10% sharing is specified.

Once the logic block partition was generated, each equation was then randomly assigned an initial macrocell placement This placement was used in a macrocell locking test that is explained later in this example.

PTM Simulators

The simulators for each of the PTM architectures, including the existing PTM, were written in C++ using the gcc compiler (available from many sources, including some commercially or publicly available operating systems, from the GNU Project/Free Software Foundation, located on the Internet at *www.gnu.org*, or from similar organizations/Internet sites). Each of the simulators was designed to fit a given number of logic block partitions generated by the logic block partition generator. The simulators were not optimized for speed or corner case partitions. Rather, they were written to do an exhaustive search for a fit based on the given partition. The simulators could be invoked using the following command line options:

```
arch [-v] [-s <% PT sharing>] [-p] [-i <cycles>]
    arch              name of architecture (existing, Alternate
                      #1, Variation #1, Variation #2)
    -v                enables verbose output
    -s <% PT sharing> specifies the percentage PT sharing,
                      defaults to 20%
    -p                enables "macrocell" locking simulation
    -i <cycles>       specifies number of simulation cycles to
                      run, defaults to 1000
```

When the simulator is invoked, it simply attempts to fit each logic block partition and gathers statistical data on the number of fits achieved based on the total and unique number of product terms in the logic block partition It is important to note that for a given percentage of product term sharing, the simulators for each PTM architecture received the exact same logic block partitions. This ensured an apples-to-apples comparison of each of the PTM architectures.

One of the evaluation metrics for the present PTM architectures was the "macrocell" locking capability of the architecture. Macrocell locking is the measure of how well a PTM architecture will fit logic block partitions if the equations are locked down to certain macrocells. This macrocell locking capability (along with the robustness of the output switch matrix in the 39000 family) may determine the attractiveness and/or feasibility of a "pin locking" feature (i.e., ability to continue using the same pin definitions for improved and/or replacement parts). These simulators evaluate macrocell locking by simply attempting to fit the logic block partition with the given initial macrocell placement. This test indicates the relative merits of each PTM architecture in terms of macrocell locking.

Simulation Results

A total of 5 different simulations were run on each of the PTM architectures:

1. 10,000 cycles with 0% product term sharing
2. 10,000 cycles with 10% product term sharing
3. 10,000 cycles with 20% product term sharing
4. 10,000 cycles with 0% product term sharing and macrocell locking
5. 10,000 cycles with 20% product term sharing and macrocell locking For each of these simulations, the parameters for the maximum number of product terms per equation and the total number of unique product terms were set to 16 and 80 respectively, regardless of the capabilities of the PTM architecture. FIGS. 5(A)–8(C) show graphs of the results of each of these simulations for each of the present PTM architectures. The results are summarized here.

Table 7 below is a summary of the percent failure, as well as the simulation time, for each of the PTM simulations. The simulation times are recorded and summarized here to simply understand what first order effects the PTM architectures might have on the amount of CPU time taken to fit the product terms into the equations. An optimized and/or heuristic algorithm may improve the fitting times dramatically, in terms of accuracy and/or absolute value.

The results in Table 7 show that Variation #2 performs the best on first time fitting, but by a small factor relative to the other architectures. However, Alternate #1 edges out Variation #2 and Variation #1 for the 20% product term sharing simulation. This is mainly due to the fact that Alternate #1 has a much more robust product term sharing capability, and therefore is able to fit more partitions that have a large percentage product term sharing.

For the macrocell locking simulations, Variation #1, as expected, is clearly better than the other PTM architectures. This is due to the ability of macrocells in Variation #1 to utilize product terms from any location in the product term array, as discussed above.

TABLE 7

Summary of PTM simulation results, fitting failure rate and simulation time.

| Architecture | % PT Sharing | Sim Length | # Failures | % Failed | Sim Time |
|---|---|---|---|---|---|
| Existing | 0 | 10000 | 181 | 1.81% | 1:36:39 |
| Alternate #1 | 0 | 10000 | 40 | 0.40% | 2:09 |
| Variation #1 | 0 | 10000 | 8 | 0.08% | 3:22 |
| Variation #2 | 0 | 10000 | 3 | 0.03% | 26:42 |
| Existing | 10 | 10000 | 907 | 9.07% | 4:12:00 |
| Alternate #1 | 10 | 10000 | 384 | 3.84% | 6:25 |
| Variation #1 | 10 | 10000 | 656 | 6.56% | 52:32 |
| Variation #2 | 10 | 10000 | 351 | 3.51% | 4:44:04 |
| Existing | 20 | 10000 | 1013 | 10.13% | 5:53:25 |
| Alternate #1 | 20 | 10000 | 512 | 5.12% | 6:59 |
| Variation #1 | 20 | 10000 | 783 | 7.83% | 1:25:26 |
| Variation #2 | 20 | 10000 | 555 | 5.55% | 6:26:24 |
| Existing | 0, Mac Lock | 10000 | 3572 | 35.72% | |
| Alternate #1 | 0, Mac Lock | 10000 | 2167 | 21.67% | |
| Variation #1 | 0, Mac Lock | 10000 | 8 | 0.08% | |
| Variation #2 | 0, Mac Lock | 10000 | 210 | 27.10% | |
| Existing | 20, Mac Lock | 10000 | 3194 | 31.94% | |
| Alternate #1 | 20, Mac Lock | 10000 | 1977 | 19.77% | |
| Variation #1 | 20, Mac Lock | 10000 | 783 | 7.83% | |
| Variation #2 | 20, Mac Lock | 10000 | 2362 | 23.62% | |

Table 8 summarizes how well each PTM architecture performs on other evaluation metrics. The perceived worst-case time from any input to any output along a combinatorial path (tPD) for the PTM architectures are ranked according to which PTM is the fastest. In every PTM architecture except the existing PTM, the physical routing distance for product terms is 16 macrocells. This is true for Variation #2 due to the circular PTM, where the first few product terms must be steered to macrocells on both ends of the logic block. Alternate #1 and Variation #1 physically route a number of product terms across all 16 macrocells. However, these architectures are able to utilize this routability advantage to enhance the fitting capability of the PTM.

The existing PTM has the fewest number of configuration bits, although Variation #2 has only 128 more configuration bits. Any additional configuration bits for the chosen PTM architecture may be offset by implementing the configuration bits with a CMOS SRAM cell, rather than a flash or EEPROM memory cell.

Finally, Table 8 addresses the ease of use metric, which includes fitting capability, by determining for each PTM architecture the maximum number of product terms that can be partitioned to the logic block and still guarantee 100% fitting success. Once again, Variation #2 performs best for first time fitting, and Variation #1 performs the best when macrocell locking is taken into account.

Conclusion

From the above summary, Variation #2 and Variation #1 are the top performing PTM architectures. A determination as to which of these two PTM architectures is more desirable for a particular application may depend upon the routing and/or routability from the macrocell to I/O pins and other clusters.

If one develops an effective routing structure such that free movement of equations within a logic block is available, then Variation #2 may be the best choice. However, the ability of Variation #1 to place equations on any desired macrocell within a logic block, regardless of the logic partitioning, may help provide a more robust global routing architecture with less cost at the global routing level.

TABLE 8

Summary of PTM simulation results, other metrics.

| Metric | Exist. | Alt. #1 | Var. #1 | Var. #2 |
|---|---|---|---|---|
| Speed | | | | |
| tPD Rank | 1 | 4 | 3 | 2 |
| PT Routing Distance (Physical) | 4 Mac | 16 Mac | 16 Mac | 16 Mac |
| Layout | | | | |
| Config Bits Required | 192 | 512 | 512 | 320 |
| Number of Different Timing Paths | 1 | 2 | 1 | 1 |
| Ease of Use | | | | |
| Max PT for 100% Fitting Success | | | | |
| 0% PT Sharing | 71 | 73 | 78 | 80 |
| 10% PT Sharing, Unique PT Count | 67 | 74 | 70 | 76 |
| 10% PT Sharing, Total PT Count | 74 | 82 | 78 | 83 |
| 20% PT Sharing, Unique PT Count | 66 | 71 | 68 | 71 |
| 20% PT Sharing, Total PT Count | 78 | 83 | 81 | 86 |
| 0% PT Sharing, Mac Locking | 29 | 39 | 78 | 32 |
| 20% PT Sharing, Mac Locking, Unique | 28 | 36 | 68 | 29 |
| 20% PT Sharing, Mac Locking,Total | 30 | 39 | 81 | 32 |

What is claimed is:

1. A product-term allocation architecture for a programmable device, comprising:
a plurality of logic gate sections, wherein:
a first one of said logic gate sections comprises a first plurality of fixed logic gates, each of said first plurality of fixed logic gates having m product term inputs, m being an integer of at least one;
a second one of said logic gate sections comprises a second plurality of fixed logic gates, each of said second plurality of fixed logic gates having n product term inputs, n being an integer of at least two and being different from m; and
said plurality of logic gate sections are configured to provide p outputs, p being an integer equal to or greater than the total number of said fixed logic gates and less than the total number of fixed logic gate inputs; and
a routable, programmable OR-type array receiving said p outputs, configured to generate a plurality of array outputs.

2. The product-term allocation architecture of claim 1, wherein said plurality of logic gate sections further comprises a third logic gate section comprising a third plurality of fixed logic gates having q inputs, q being an integer of at least three and being different from n and m.

3. The product-term allocation architecture of claim 1, wherein said plurality of logic gate sections further comprises a fourth logic gate section comprising a fourth plurality of fixed logic gates having r inputs, r being an integer of at least four and being different from n, m and q.

4. The product-term allocation architecture of claim 1, wherein said fixed logic gates each comprise an OR or NOR gate.

5. The product-term allocation architecture of claim 1, wherein p is equal to the total number of said fixed logic gates.

6. The product-term allocation architecture of claim 1, wherein any one of said p outputs is routable to any one of said array outputs.

7. A logic block, comprising:
the product-term allocation architecture of claim 1; and
a plurality of macrocells receiving said array outputs.

8. The logic block of claim 7, wherein the total number of said array outputs equals the total number of said macrocells.

9. A method of allocating product terms in a product term matrix, comprising the steps of:
logically combining a first set of product terms in a first fixed logic gate section to provide a first set of logically combined product term outputs, each fixed logic gate in said first fixed logic gate section receiving m product terms, m being an integer of at least one;
logically combining a second set of product terms in a second fixed logic gate section to provide a second set of logically combined product term outputs, each fixed logic gate in said second fixed logic gate section receiving n product terms, n being an integer of at least two and being different from m; and
routing the logically combined product term outputs in a programmable array to provide a plurality of programmable array outputs, wherein any one of said logically combined product term outputs can be routed to any one of said programmable array outputs.

10. An architecture for allocating product terms in a product term matrix, comprising:
means for logically combining a first set of product terms in a first fixed logic gate section to provide a first set of logically combined product term outputs, each fixed logic gate in said first fixed logic gate section receiving m product terms, m being an integer of at least one;
means for logically combining a second set of product terms in a second fixed logic gate section to provide a second set of logically combined product term outputs, each fixed logic gate in said second fixed logic gate section receiving n product terms, n being an integer of at least two and being different from m; and
means for routing the logically combined product term outputs in a programmable array to provide a plurality of programmable array outputs, wherein any one of said logically combined product term outputs can be routed to any one of said programmable array outputs.

11. The architecture according to claim 1, wherein said architecture further comprises an AND gate array, wherein said array comprises a number of AND gates each having one or more product term outputs.

12. The architecture according to claim 11, wherein said array comprises NAND gates.

13. The architecture according to claim 1, wherein any one or more of said p outputs can be routed to any one or more of said m and n inputs.

14. The architecture according to claim 1, wherein one or more of said m and n inputs are global product terms.

* * * * *